(12) United States Patent
Schultz et al.

(10) Patent No.: US 11,508,643 B2
(45) Date of Patent: Nov. 22, 2022

(54) THERMAL INTERFACE FORMED BY CONDENSATE

(71) Applicant: International Business Machines Corporation, Armonk, NY (US)

(72) Inventors: Mark D. Schultz, Ossining, NY (US); John Peter Karidis, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 999 days.

(21) Appl. No.: 16/235,470

(22) Filed: Dec. 28, 2018

(65) Prior Publication Data

US 2020/0211924 A1    Jul. 2, 2020

(51) Int. Cl.
*G01R 31/28*  (2006.01)
*H01L 23/427*  (2006.01)

(52) U.S. Cl.
CPC ........ *H01L 23/427* (2013.01); *G01R 31/2877* (2013.01); *G01R 31/2898* (2013.01)

(58) Field of Classification Search
CPC  G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 6,085,831 A | 7/2000 | DiGiacomo et al. | |
| 6,737,071 B2 | 5/2004 | Hao et al. | |
| 7,369,410 B2 | 5/2008 | Chen et al. | |
| 7,435,622 B2 | 10/2008 | Colbert et al. | |
| 7,599,185 B2 | 10/2009 | Meyer, IV et al. | |
| 7,965,511 B2 | 6/2011 | Refai-Ahmed | |
| 8,018,719 B2 | 9/2011 | Busch | |
| 8,471,575 B2 * | 6/2013 | Fregeau | G01R 31/2874 324/750.04 |
| 9,980,410 B1 | 5/2018 | Wei et al. | |
| 2005/0173098 A1 | 8/2005 | Connors | |
| 2005/0200376 A1 * | 9/2005 | Yee | G01R 31/2875 324/750.01 |
| 2005/0274487 A1 | 12/2005 | Goth | |

OTHER PUBLICATIONS

Kosar, A., et al., "Convective flow of refrigerant (R-123) across a bank of micro pin fins," International Journal of Heat and Mass Transfer (2006), Received Apr. 18, 2005, Revised Dec. 22, 2005, Available online Apr. 5, 2006, pp. 3142-3155, vol. 49.

* cited by examiner

*Primary Examiner* — Tung X Nguyen
(74) *Attorney, Agent, or Firm* — Scully, Scott, Murphy & Presser, P.C.; Daniel P. Morris

(57) ABSTRACT

Methods and apparatus of forming a thermal interface with condensate are described. In an example, a device may be disposed in a test environment or a test apparatus. An amount of condensate may be accumulated on a heat sink to coat the heat sink with a layer of condensate. The coated heat sink may be disposed on the device, where the layer of condensate is directed towards the device, and the disposal of the coated heat sink causes the layer of condensate to spread among voids between the heat sink and the device to form a thermal interface that includes the condensate. A test may be executed on the device with the thermal interface comprising the condensate between the coated heat sink and the device.

12 Claims, 4 Drawing Sheets

／／／／／／／／／／／／／／／／／／／／／／／

THERMAL INTERFACE FORMED BY CONDENSATE

BACKGROUND

The present application relates to semiconductor devices. More particularly, the present application relates to a thermal interface between a heat sink and a device.

In a testing environment, a heat sink may be disposed on a device under test (DUT) to extract heat generated by the DUT during a test. A thermal interface may be formed between the heat sink and the DUT to reduce the thermal contact resistance between the heat sink and the DUT. Liquid thermal interfaces (LTI) are thermal interfaces formed by using liquid as thermal interface materials (TIM). A reduction in the thermal contact resistance between the heat sink and the DUT may improve an efficiency of the heat extraction performed by the heat sink on the DUT.

SUMMARY

In some examples, a method of forming a thermal interface is generally described. The method may include accumulating an amount of condensate on a heat sink to coat the heat sink with a layer of condensate. The method may further include disposing the coated heat sink on the device. The layer of condensate may be directed towards the device, and the disposing may cause the layer of condensate to spread among voids between the heat sink and the device to form a thermal interface including the condensate.

In some examples, an apparatus of providing a thermal interface to a device under test is generally described. The apparatus may include a heat sink, a power supply, and a material dispenser. The material dispenser may be operable to release a material on the heat sink to accumulate an amount of condensate on the heat sink, such that the heat sink may be coated with a layer of condensate. The coated heat sink may be disposed on a device in the apparatus. The layer of condensate may be directed towards the device, and the disposal of the coated heat sink may cause the layer of condensate to spread among voids between the heat sink and the device to form a thermal interface with the condensate. The power supply may be operable to provide power to the device. In response to the device receiving power from the power supply, the apparatus may execute a test on the device with the thermal interface formed by the condensate between the coated heat sink and the device.

In some examples, an apparatus of providing a thermal interface to a device under test is generally described. The apparatus may include a heat sink, a power supply, a material dispenser, and a controller. The material dispenser may be operable to release a material. The controller may be configured to determine an ambient dew point of an environment of the apparatus. The controller may be further configured to control the material dispenser to release the material on the heat sink to accumulate an amount of condensate on the heat sink, such that the heat sink may be coated with a layer of condensate. The coated heat sink may be disposed on a device in the apparatus, and the layer of condensate may be directed towards the device. The disposal of the coated heat sink may cause the layer of condensate to spread among voids between the coated heat sink and the device to form a thermal interface with the condensate. The accumulation may be based on the determined ambient dew point. The controller may be further configured to activate the power supply to provide power to the device. In response to the device receiving the power from the power supply, the apparatus may execute a test on the device with the thermal interface formed by the condensate between the coated heat sink and the device.

Further features as well as the structure and operation of various embodiments are described in detail below with reference to the accompanying drawings. In the drawings, like reference numbers indicate identical or functionally similar elements.

DETAILED DESCRIPTION

In an example, water may be used as a liquid thermal interface, and does not require particular protective measures of other liquids such as liquid metal. For example, liquid metal may interact with or may dissolve a number of commonly used metals, such as aluminum. Thus, protective measures, such as using metals that do not react with typical gallium-based liquid metal interfaces (e.g., nickel) to prevent the liquid metal from the non-protected device elements, can be implemented. However, in some examples, the water being used to form the thermal interface may leak and flow towards a back of the device, and contact with C4 (controlled collapse chip connection) structures of the device, which may include solder bumps, on the back of the device. As water contacts the solder bumps, corrosion of the device may occur. Although non-corrosive liquids may be used to form the LTI, non-corrosive liquids tend to have thermal performance inferior to water. Thus, there is a need for a thermal interface that utilizes water in the LTI while substantially reducing the chance that the LTI would come into contact with the C4 structures or other sensitive structures on the DUT.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
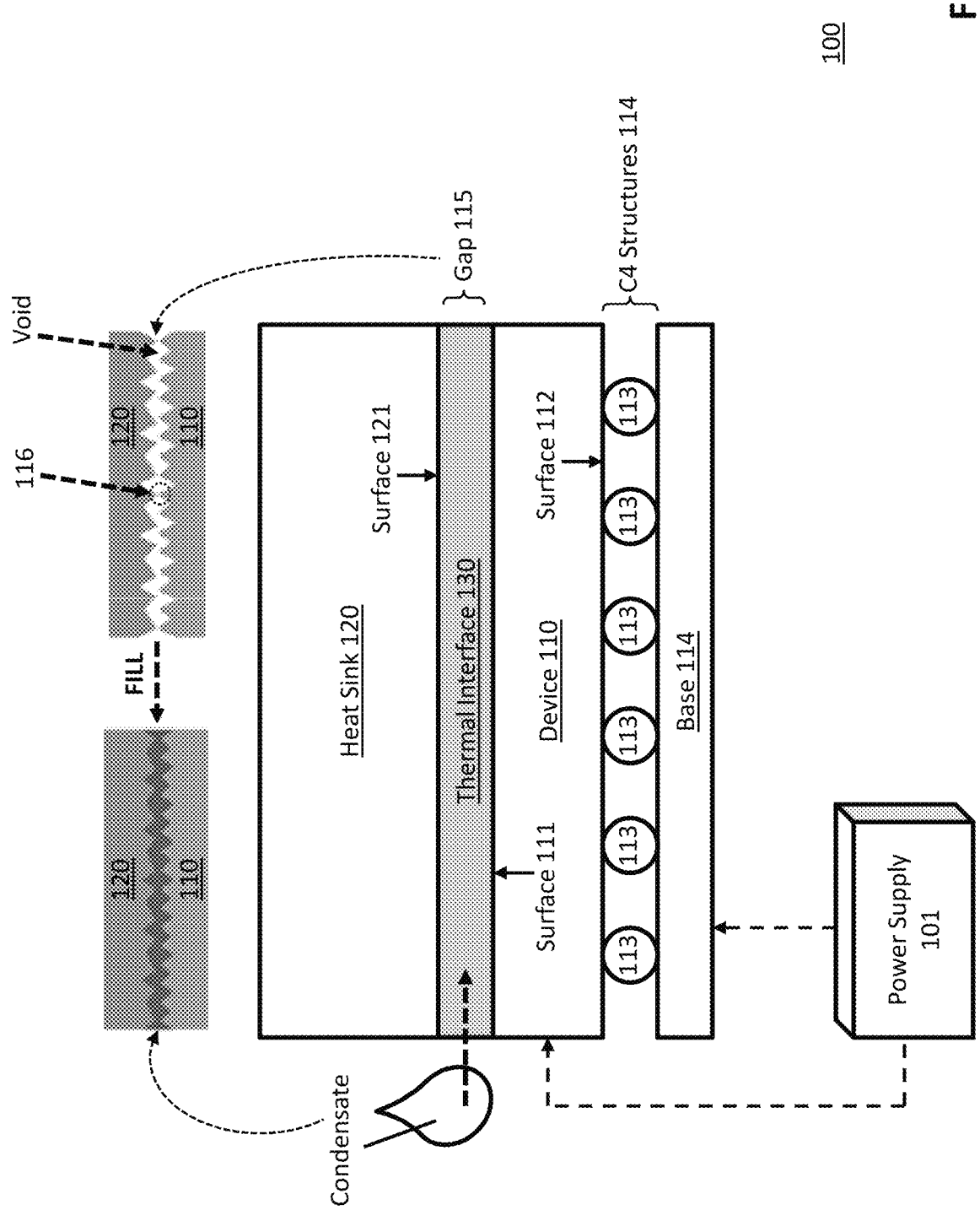
FIG. 1 illustrates an example test environment that may be implemented with a thermal interface formed by condensate, in one embodiment.

FIG. 1 illustrates an example test environment 100 that may be implemented with a thermal interface formed by condensate, in one embodiment. A device 110, such as a semiconductor chip, may be a device under test (DUT) in the test environment 100, or test apparatus 100. The test environment 100 may facilitate various types of tests, such as wafer probe, stress test, and/or other types of tests, on the device 110. The test environment 100 may include a power supply 101, a base 114, and a heat sink 120. The heat sink 120 may be a structure that is being used to extract heat dissipated from the device 110 to prevent overheating the device 110. The power supply 101 may be operable to provide power to a device being tested in the test environment 100. In some examples, the power supply 101 may provide power to the base 114, such that when a DUT (e.g., the device 110) is placed on the base 114, the power supply 101 may provide power to the device 110 via the base 114. In some examples, the base 114 may be a socket capable of receiving and/or supporting a DUT or an integrated circuit (IC). In some examples, the base 114 may include electrical leads such that when device 101 is disposed on the base 114, the power provided by the power supply 101 to the base 114 may be transmitted to the device 110 via the electrical leads. In some examples, the device 110 may be flip-chip device, such that a surface 112 of the device 110 includes a plurality of solder bumps 113, where the solder bumps 113 are collectively labeled as C4 structures in FIG. 1. When the device 110 is a flip-chip device, the surface 111 may be a bottom surface and the surface 112 may be a top surface. To be described in more detail below, the methods in accordance with the present disclosure facilitates formation of a thermal interface 130 using condensate without the liquid from the condensate being leaked to contact the solder bumps 113, such that corrosion of the device 110 may be avoided.

In some examples, a surface 111 of the device 110 and a surface 121 of the heat sink 120 may be non-flat, such that a gap 115 between the heat sink 120 and the device 110 may include a plurality of voids. Since the voids within the gap 115 are filled with air, any heat transfer conducted between the contacted portions of the heat sink 120 and the device 110 (e.g., a contact point 116 shown in FIG. 1) may cause radiation of the conducted heat among the voids in the gap 115. The heat transfer through voids in the gap thus causes an increase in the thermal contact resistance between the device 110 and the heat sink 120. An increasing amount of thermal contact resistance between the device 110 and the heat sink 120 may reduce an efficiency of heat extraction performed by the heat sink 120. Thus, there is a need to reduce the thermal contact resistance between the device 110 and the heat sink 120, such that the efficiency of heat extraction performed by the heat sink 120 may be improved. In some examples, the gap 115 may be filled with a thermal interface material to reduce the thermal contact resistance between the heat sink 120 and the device 110.

To be described in more detail below, the device 110 may be disposed on the base 114 as a DUT, and may be subject to a test by the test environment 100. Prior to executing the test on the device 110, a layer of condensate may be formed or accumulated on the surface 121 of the heat sink 120, such that the surface 121 of the heat sink 120 is coated with the layer of condensate. The coated heat sink 120 may be disposed on the device 110 at an orientation where the layer of condensate is directed towards the device 110, and may be in contact with the surface 111 of the device 110. The disposal of the coated heat sink 120 on the device 110 may cause the layer of condensate to spread among the voids within the gap 115, thus forming a thermal interface 130 including condensate as the thermal interface material. The layer of condensate may be formed by material such as water, or other types of organic liquid with a vapor pressure near room temperature (e.g., ethanol), or organic liquids with relatively lower vapor pressure (e.g., pentadecane).

Figure 2:
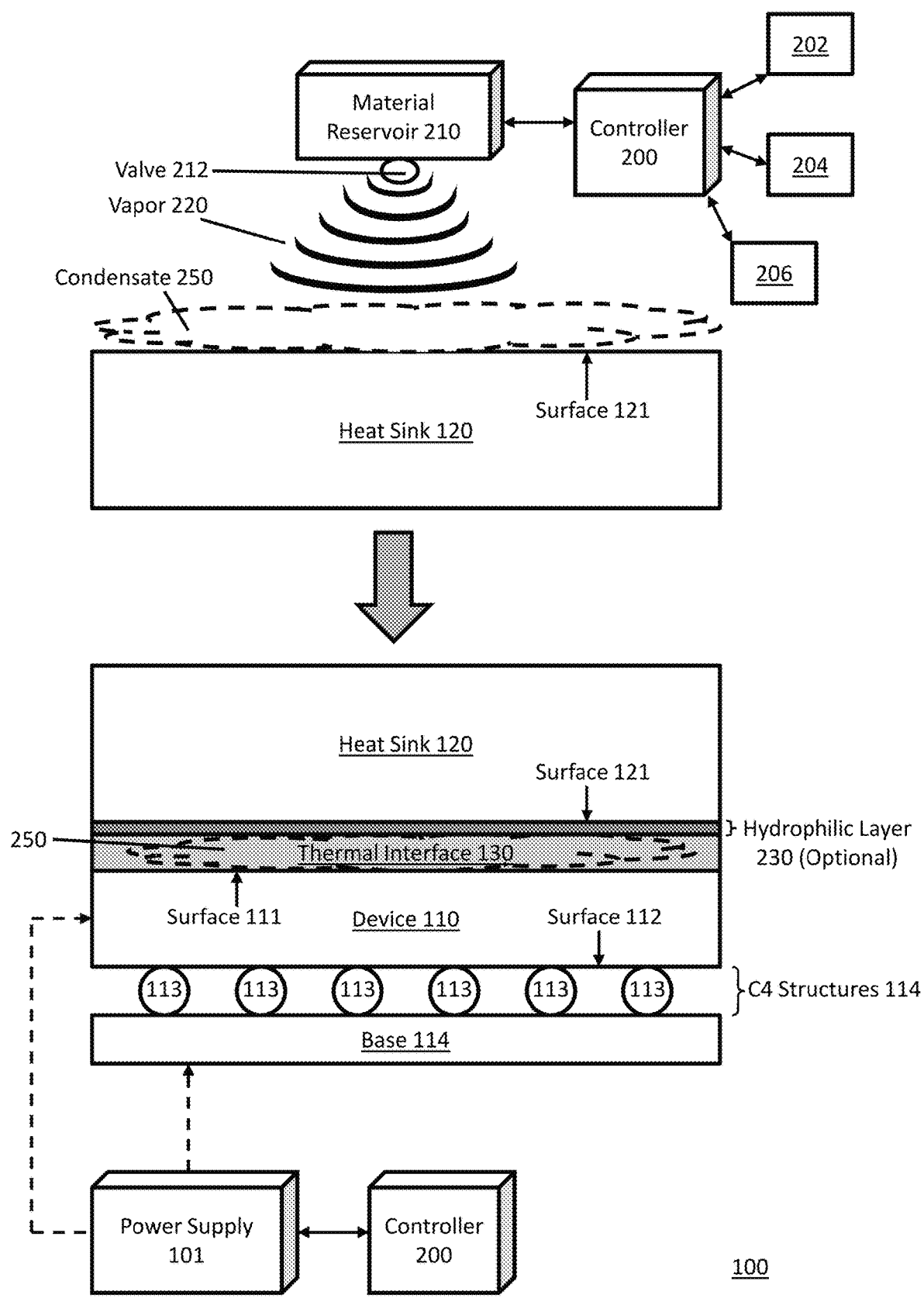
FIG. 2 illustrates an implementation of the example test environment shown in FIG. 1 with additional details, in one embodiment.

FIG. 2 illustrates an implementation of the example test environment shown in FIG. 1 with additional details, arranged in accordance with at least some embodiments presented herein. FIG. 2 may include components that are labeled identically to components of FIG. 1, which will not be described again for the purposes of clarity. The description of FIG. 2 may reference at least some of the components of FIG. 1.

In an example shown in FIG. 2, a layer of condensate 250 may be accumulated on the heat sink 120 using vapor with a temperature higher than the ambient dew point of the test environment 100 or heat sink 120. In an example embodiment, a plurality of components of the test environment 100 may be used to form the layer of condensate 250 on the heat sink 120. The test environment 100 may further include a controller 200, a temperature sensor 202, a humidity sensor 204, a heating element 206, and/or a vapor reservoir 210. The controller 200, in some examples, may be a computer device comprising a processor and a memory. The controller 200 may be configured to control operations of the power supply 101, the temperature sensor 202, the humidity sensor 204, the heating element 206, and/or the vapor reservoir 210. The temperature sensor 202 may be configured to detect and/or measure an ambient temperature of the test environment 100. The humidity sensor 202 may be configured to detect and/or measure an ambient relative humidity of the test environment 100. The heating element 206 may be a device operable to dissipate heat, such as releasing hot air. The vapor reservoir 210 may store liquid-vapor mixture, such as vapor 220, where vapor 220 may be composed of water, ethanol, or other liquids. The vapor reservoir 210 may be connected to a tube attached to a switch, or a valve 212, that may be controlled by the controller 200, such that when the valve 212 is opened by the controller 200, the vapor 220 is released from the vapor reservoir 210.

In an example, prior to forming the layer of condensate 250, the controller 200 may determine the ambient due point $T_{dp}$ of the test environment. The temperature sensor 202 may measure an ambient temperature $T_{amb}$ of the test environment 100, and the humidity sensor 204 may measure an ambient relative humidity RH of the test environment 100. The controller 200 may obtain the ambient temperature $T_{amb}$ from the temperature sensor 202, and may obtain the ambient relative humidity RH from the humidity sensor 204. The controller 200 may determine the ambient dew point $T_{dp}$ of the test environment 100 based on the ambient temperature $T_{amb}$ and the ambient relative humidity RH. In some examples, the test environment 100 may further include sensors (not shown) configured to directly measure the ambient dew point $T_{dp}$ of the test environment 100.

In an example, the vapor 220 may be stored in the vapor reservoir 210 at a temperature above the ambient dew point $T_{dp}$ (e.g., approximately 20° C. to 50° C. above $T_{dp}$). The controller 200 may be configured to open the valve 212 to release the vapor 220 from the vapor reservoir 210. The layer of condensate 250 may be accumulated on the heat sink 120 by positioning the heat sink 120 to receive the vapor 220 being released from the vapor reservoir 210. For example, the heat sink 120 may be positioned such that the surface 121 faces the valve 212, which causes the vapor 220 to be released onto the surface 121 of the heat sink 120. In one aspect, due to the vapor 220 being stored at a temperature above the ambient dew point $T_{dp}$, the release of the vapor 220 into the ambient environment of the test environment 100 causes the temperature of the vapor 220 to decrease. Thus, when the vapor 220 with decreased temperature contacts the surface 121, condensate may be formed on the surface 121. The temperature of the heat sink 120 may also be changed to increase or decrease the rate of condensation.

The controller 200 may keep the valve 212 opened until a target amount of condensate is accumulated on the heat sink 120. An amount of time $S_v$ to keep the valve 212 opened, or to release the vapor 220, in order for the target amount of condensate to be formed on the heat sink 120 may be based on a size of the device 110, a size of the heat sink 120, the ambient dew point $T_{dp}$, the temperature of the vapor 220, and/or other factors. The target amount of condensate may be defined as an amount of condensate that may fill the voids of the gap 115 without leaking any portion of the condensate to the C4 structures 114 of the device 110. The target amount of condensate may be determined based on attributes, such as a surface area and an out-of flatness level, of the surface 121 of the heat sink 120 and/or the surface 111 of the device 110. For example, if an out-of flatness level of the surface 121 of the heat sink 120 and the surface 111 of the device 110 is five microns each, the target amount of condensate may be determined by multiplying 0.010 millimeters (five microns plus five microns) by a surface area of the device 110 (or surface area of the surface 111), in millimeters, which results in a volume of condensate measured in cubic millimeters ($mm^3$).

In an example, the controller 200 may receive an input, such as from an operator of the test environment 100, indicating the surface area of the surface 111 of the device 110. The controller 200, based on the received surface area of the device 110, the ambient dew point $T_{dp}$, the temperature of the vapor 220, the out-of-flatness level of the surface 121 of the heat sink 120 and/or the surface 111 of the device 110, and/or other factors, may determine the target amount of condensate to be accumulated on the heat sink 120. The controller 200 may further determine the time $S_v$, based on the target amount of condensate, to keep the valve 212 opened, such that the controller 200 may close the valve 212 at an appropriate time. Thus, the amount of condensate being used to form the thermal interface 130 may be controlled based on various known factors, without requiring any direct handling or dispersal of the liquid.

The heat sink 120 coated with the layer of condensate 250 may be disposed on the device 110 in an orientation where the layer of condensate 250 is directed at, or facing, the surface 111 of the device 110. Disposing the coated heat sink 120 on the device 110 may cause the layer of condensate 250 accumulated on the surface 121 to spread among the voids of the gap 115. For example, the coated heat sink 120 may be disposed on the device 110 at a relatively slow pace in order to utilize capillary forces to evenly spread the condensate among the voids within the gap 115. The condensate spread among the voids within the gap 115 forms the thermal interface 130, such that the condensate is being used as a thermal interface material between the heat sink 120 and the device 110.

In another embodiment, instead of releasing vapor 220 onto the surface 121 of the heat sink 120, the vapor 220 may be released on the surface 111 of the device 110 to coat the surface 111 with the layer of condensate 250. Thus, disposing the heat sink 120, which is not coated with condensate, on the coated surface 111 of the device 110 may also spread the condensate among the voids of gap 115 to form the thermal interface 130. In another example embodiment, the vapor may be released on both the heat sink 120 and the device 110, such that the condensate may be accumulated on both the device 110 and the heat sink 120. Thus, disposing the coated heat sink 120 onto the coated device 110 may also spread the condensate among the voids of gap 115 to form the thermal interface 130.

In some examples, a hydrophilic layer 230 may be disposed on the surface 121 of the heat sink 120 prior to releasing the vapor on the heat sink 120. The hydrophilic layer 230 may keep the condensate of the thermal interface 130 in place in order to avoid liquid flowing under the device 110 to reach the C4 structures 114.

The controller 200 may activate the power supply 101 to provide power to the device 110, such that the test environment or apparatus 100 may execute a test on the device 110 with the coated heat sink 120 disposed on the device 110. In some examples, the coated heat sink 120 may be removed from the device 110 after a completion of the test on the device 110. The controller 200 may control the heating element 206, such as by activating the heating element 206, to apply heat on the coated heat sink 120 removed from the device 110. The application of heat on the coated heat sink 120 may raise a temperature of the heat sink 120 to a temperature $T_{high}$ above the ambient dew point $T_{dp}$. The application of heat on the coated heat sink 120 to raise the temperature of the heat sink 120 to $T_{high}$ may continue until essentially all condensate 250 is evaporated. Thus, when the test environment 100 needs to perform a new test on the same or different device in a subsequent instance, a new layer of condensate may be accumulated on the heat sink 120 using the methods described above, in order to ensure that each instance of test performed by the test environment 100 utilizes an appropriate amount of condensate to form the thermal interface 130 for different devices under test and/or different ambient environments.

Figure 3:
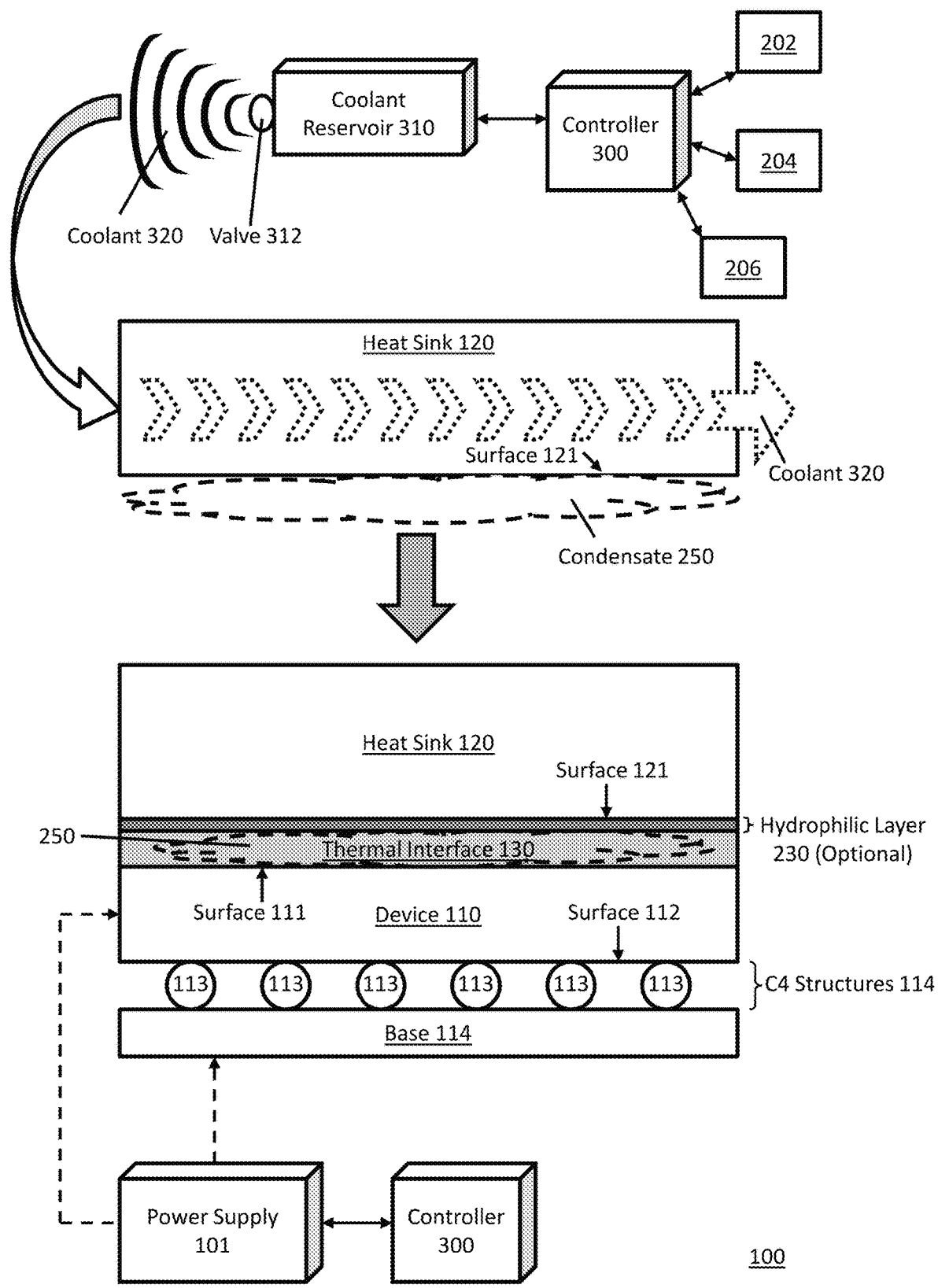
FIG. 3 illustrates an implementation of the example test environment shown in FIG. 1 with additional details, in one embodiment.

FIG. 3 illustrates an implementation of the example test environment shown in FIG. 1 with additional details, arranged in accordance with at least some embodiments presented herein. FIG. 3 may include components that are labeled identically to components of FIGS. 1-2, which will not be described again for the purposes of clarity. The description of FIG. 3 may reference at least some of the components of FIGS. 1-2.

In an example shown in FIG. 3, the test environment 100 may include a coolant reservoir 310 and a controller 300. The controller 300, in some examples, may be a computer device comprising a processor and a memory. The controller 300 may be configured to control operations of the power supply 101, the temperature sensor 202, the humidity sensor 204, the heating element 206, and/or the coolant reservoir 310. In some examples, the controller 300 may be same as the controller 200 shown in FIG. 2. In some examples, the controller 200 and the controller 300 may be components of the same device, testing apparatus, or machine. The coolant reservoir 310 may include a switch, or a valve 312 that may be controlled by the controller 300, such that when the valve 312 is opened by the controller 300, the coolant reservoir 310 releases liquid coolant, or coolant 320. The coolant 320 may be released on the heat sink 120, such as being released into channels between fins of the heat sink 120, to cause the coolant 320 to flow through the heat sink 120. The layer of condensate 250 may be accumulated on the heat sink 120 by lowering a temperature of the heat sink 120 to a target temperature below an ambient dew point of the test environment 100 for a particular amount of time. The controller 300 may control a temperature of the coolant 320 in order to control the temperature of the heat sink 120. For example, the controller 300 may release coolant 320 at a temperature lower than a current temperature of the heat sink 120 to lower the temperature of the heat sink 120, or may release the coolant 320 at a temperature higher than the current temperature of the heat sink 120 to increase the temperature of the heat sink 120.

The controller 300 may keep the valve 312 opened to release the coolant 320 to flow through the heat sink 120, for an amount of time $S_c$, until the temperature of the heat sink 120 reaches a target temperature $T_{low}$ below the ambient dew point $T_{dp}$. Once the temperature of the heat sink 120 falls below ambient dew point $T_{dp}$, the layer of condensate 250 may start to form on the surface 121 of the heat sink 120. The target temperature of $T_{low}$ may be lower than the ambient dew point $T_{dp}$, such as approximately 10° C. to 20° C. below the ambient dew point $T_{dp}$, in order to ensure that the target amount of condensate is formed on the heat sink 120. If $T_{low}$ is set to a temperature $T_{dp}-1°$ C., then the controller 300 may close the valve 312 when the temperature of the heat sink 120 reaches $T_{dp}-1°$ C. If $T_{low}$ is set to a temperature $T_{dp}-10°$ C., then the controller 300 may close the valve 312 when the temperature of the heat sink 120 reaches $T_{dp}-10°$ C. Thus, the as the value of $T_{low}$ decrease, the time $S_c$ to release the coolant 320 to flow through the heat sink 120 increases, and the amount of condensate being accumulated on the heat sink 120 increases.

In an example, the controller 300 may receive an input, such as from an operator of the test environment 100, indicating the surface area of the surface 111 of the device 110. The controller 300, based on the received surface area of the device 110, the ambient dew point $T_{dp}$, the target temperature $T_{low}$, the out-of-flatness level of the surface 121 of the heat sink 120 and/or the surface 111 of the device 110, and/or other factors, may determine the target amount of condensate to be accumulated on the heat sink 120. The controller 300 may further determine the time $S_c$, based on the target amount of condensate, to keep releasing the coolant 320, such that the controller 300 may close the valve 312 at an appropriate time. The controller 300 may further determine the temperature of the coolant 320 to be released based on the target amount of condensate and/or the time $S_c$. For example, if the target amount of condensate is denoted as V $mm^3$, and a rate to release the coolant 320 at a particular temperature is X $mm^3$/second, then the time $S_c$ may be determined based on a division V/X and/or other operations relating to the ambient dew point $T_{dp}$, the target temperature $T_{low}$, and/or other factors. In another example, lowering the temperature of the coolant 320 may decrease the time $S_c$, as the temperature of the heat sink 120 may be lowered at an increased rate if the temperature of the coolant 320 is lowered. Thus, the amount of condensate being used to form the thermal interface 130 may be controlled based on various known factors, without requiring any direct handling or dispersal of the liquid.

In some examples, the coated heat sink 120 may be removed from the device 110 after a completion of the test on the device 110. The controller 300 may control the coolant reservoir 310 to release the coolant 320 at a temperature higher than a current temperature of the removed heat sink 120. The released coolant 320 at the temperature higher than the current temperature of the removed heat sink 120 may flow through the removed heat sink 120 to raise the temperature of the removed heat sink 120 to $T_{high}$ above the ambient dew point $T_{dp}$. The flow of coolant 320 at high temperatures through the removed heat sink 120 may continue until essentially all condensate 250 is evaporated. Thus, when the test environment 100 needs to perform a new test on the same or different device in a subsequent instance, a new layer of condensate may be accumulated on the heat sink 120 using the methods described above, in order to ensure that each instance of test performed by the test environment 100 utilizes an appropriate amount of condensate to form the thermal interface 130 for different devices under test and/or different ambient environments.

In some examples, the device 110 may be used as a model device, or a thermal test vehicle, to obtain different observations of the thermal performance of the heat sink 120 and/or the device 110 based on the thermal interface 130. For example, a plurality of tests may be executed on the device 110, where each test may correspond to a different ambient temperature, relative humidity, vapor type being used, time to run coolant through the heat sink 120, target temperature $T_{low}$, amount of condensate accumulated on the heat sink 120, and/or other variables associated with the accumulation of the layer of condensate 250 on the heat sink 120. Each test may result in a different performance that can be measured by an end temperature of the device 110 and/or the heat sink 120 after completing each test, the amount of voids within gap 115 being covered by the condensate, whether there is a leak to the C4 structures 114, and/or other performance measures. Based on the different observations, the controller 200 and/or 300 may set parameters such as a limit to the amount of condensate being formed, a limit to the time S, a limit to the target temperature $T_{low}$, and/or other parameters, where the parameters may be used by the controller 200 and/or 300 in future instances to ensure that an appropriate amount of condensate is being accumulated to form the thermal interface 130 (e.g., sufficient to spread among the voids of the gap 115, yet does not leak to the C4 structures 114). The results from the observations, and the determined parameters, may be stored in the memory of the controller 200 and/or 300. By using previous observations to set various parameters, the amount of condensate accumulated on the heat sink 120 may be controlled based on experimental results, and the risk of having excess liquid leak to the C4 structures 114 of the device 110 may be reduced. Further, by storing the observations and parameters, the controller 200 and/or 300 may continue to adjust the parameters based on new experimental data.

Figure 4:
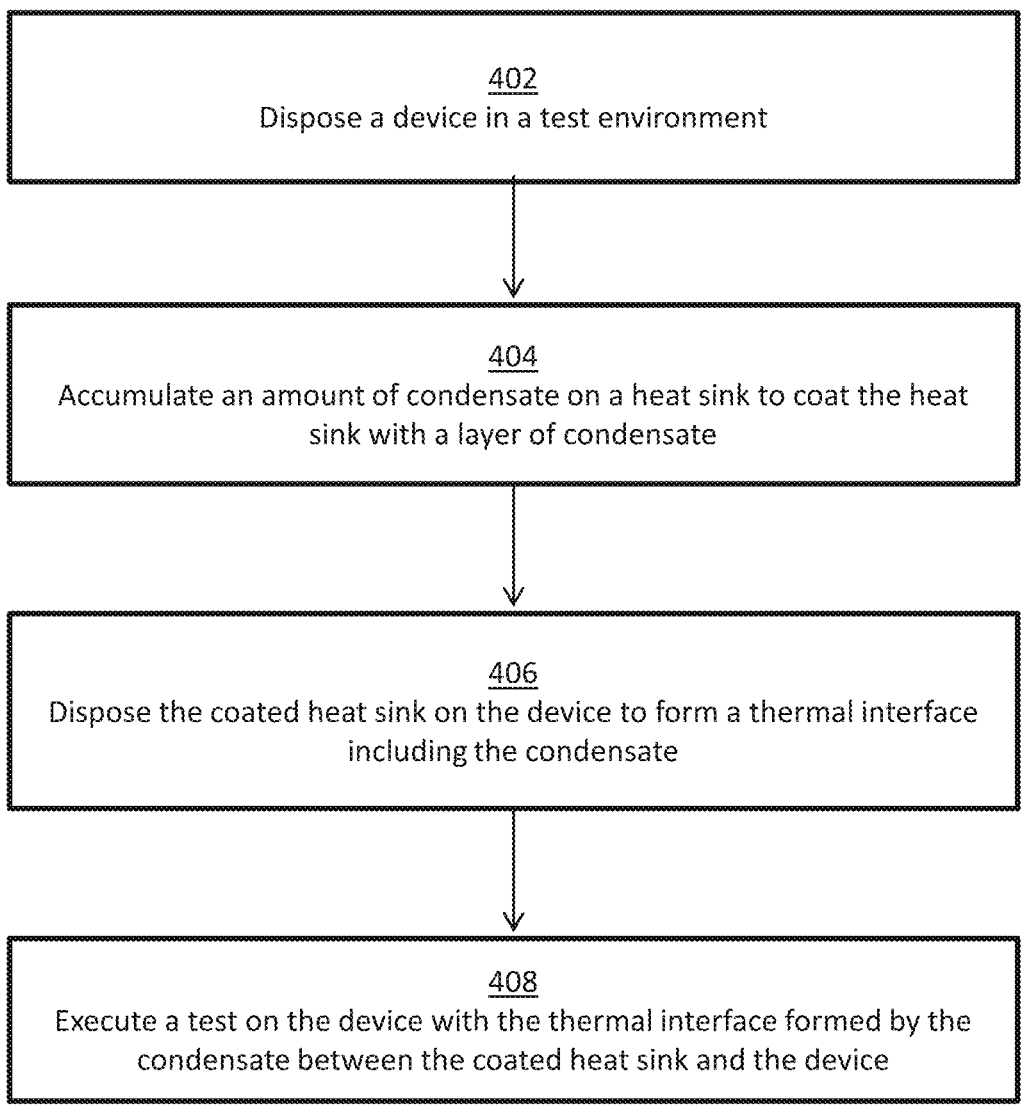
FIG. 4 illustrates a flow diagram relating to a process to implement the test environment of FIG. 1 with a thermal interface formed by condensate, in one embodiment.

FIG. 4 illustrates a flow diagram relating to a process to implement a test environment with a thermal interface formed by condensate, arranged in accordance with at least some embodiments presented herein. The process in FIG. 4 may be implemented using, for example, system 100 discussed above. An example process may include one or more operations, actions, or functions as illustrated by one or more of blocks 402, 404, 406, and/or 408. Although illustrated as discrete blocks, various blocks may be divided into additional blocks, combined into fewer blocks, eliminated, or performed in parallel, depending on the desired implementation.

The processing may begin at block 402, where a device is disposed in a test environment, or a test apparatus. The processing continues from block 402 to block 404, where an amount of condensate is accumulated on a heat sink, such that the heat sink is coated with a layer of condensate. In one embodiment, the accumulation includes lowering a temperature of the heat sink to a target temperature below an ambient dew point of the test environment for an amount of time. In another embodiment, the accumulation includes releasing vapor on the heat sink for an amount of time, where the vapor is stored at a temperature above the ambient dew point of the test environment. The amount of time to lower the temperature of the heat sink and/or to release the stored vapor on the heat sink is based on a size of the device. In some examples, prior to the accumulation, a hydrophilic layer is disposed on the heat sink.

The processing may continue from block 404 to block 406, where the coated heat sink is disposed on the device.

The coated heat sink is disposed at an orientation where the layer of condensate is directed towards the device. The disposal of the coated heat sink causes the layer of condensate to spread among the voids between the heat sink and the device to form a thermal interface with the condensate.

The processing may continue from block 406 to block 408, where the test environment executes a test on the device with the thermal interface formed by the condensate between the heat sink and the device. In some examples, the coated heat sink is removed from the device. The removed heat sink is heated to a temperature above an ambient dew point of the test environment until the amount of condensate is evaporated.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
    a heat sink;
    a power supply;
    a reservoir that stores a material;
    a controller configured to release the material stored in the reservoir on the heat sink to accumulate an amount of condensate on the heat sink, such that the heat sink is coated with a layer of condensate;
    wherein the coated heat sink is disposed on a device in the apparatus, the layer of condensate is directed towards the device, and the disposal of the coated heat sink causes the layer of condensate to spread among voids between the heat sink and the device to form a thermal interface comprising the condensate;
    wherein the power supply is operable to provide power to the device; and
    wherein in response to the device receiving power from the power supply, the apparatus executes a test on the device with the thermal interface formed by the condensate between the coated heat sink and the device.

2. The apparatus of claim 1 further comprises a heating element operable to heat the coated heat sink to a temperature above an ambient dew point of an environment of the apparatus until the amount of condensate is evaporated.

3. The apparatus of claim 1, wherein the material is a coolant, and the accumulation of the amount of condensate comprises a release of the coolant to flow through the heat sink to lower a temperature of the heat sink to a target temperature below an ambient dew point of an environment of the apparatus for an amount of time.

4. The apparatus of claim 3, wherein the amount of time ends when the amount of condensate is accumulated on the heat sink, and wherein the amount of time and the amount of condensate is based on a surface area of a surface of the device.

5. The apparatus of claim 1, wherein the material is vapor, and the accumulation of the amount of condensate on the heat sink comprises a release of vapor on the heat sink for an amount of time, and wherein the accumulated condensate is formed from the released vapor.

6. The apparatus of claim 5, wherein the amount of time ends when the amount of condensate is accumulated on the heat sink, and wherein the amount of time and the amount of condensate is based on a surface area of a surface of the device.

7. The apparatus of claim 1, wherein a hydrophilic layer is disposed on the heat sink prior to the accumulation of the amount of condensate.

8. An apparatus comprising:
    a heat sink;
    a power supply;
    a reservoir that stores a material;
    a controller configured to:
        determine an ambient dew point of an environment of the apparatus;
        release the material stored in the reservoir on the heat sink to accumulate an amount of condensate on the heat sink, such that the heat sink is coated with a layer of condensate, wherein the coated heat sink is disposed on a device in the apparatus, the layer of condensate is directed towards the device, and the disposal of the coated heat sink causes the layer of condensate to spread among voids between the coated heat sink and the device to form a thermal interface comprising the condensate, and the accumulation is based on the determined ambient dew point;
        activate the power supply to provide power to the device; and
    wherein in response to the device receiving the power from the power supply, the apparatus executes a test on the device with the thermal interface formed by the condensate between the coated heat sink and the device.

9. The apparatus of claim 8 further comprises a heating element, wherein the controller is configured to activate the heating element to heat the coated heat sink to a temperature above the ambient dew point of the test environment until the amount of condensate is evaporated.

10. The apparatus of claim 8, wherein the material is a coolant, and the controller is further configured to control a valve connected to the reservoir to release the coolant to flow through the heat sink to lower a temperature of the heat sink to a target temperature below the ambient dew point of the environment of the apparatus for an amount of time, wherein the amount of time ends when the amount of condensate is accumulated on the heat sink, and wherein the amount of time and the amount of condensate is based on a surface area of a surface of the device.

11. The apparatus of claim 8, wherein the material is vapor, and the controller is further configured to control a valve connected to the reservoir to release the vapor on the heat sink for an amount of time, the amount of time ends when the amount of condensate is accumulated on the heat sink, the accumulated condensate is formed from the released vapor, and the amount of time and the amount of condensate is based on a surface area of a surface of the device.

12. The apparatus of claim 8, wherein a hydrophilic layer is disposed on the heat sink prior to the accumulation of the amount of condensate.

\* \* \* \* \*